(12) United States Patent
Yasuhiro

(10) Patent No.: US 9,122,150 B2
(45) Date of Patent: Sep. 1, 2015

(54) METHOD FOR MANUFACTURING COLOR FILTER

(71) Applicant: Ye Xin Technology Consulting Co., Ltd., Hsinchu (TW)

(72) Inventor: Mizuno Yasuhiro, Hsinchu (TW)

(73) Assignee: Ye Xin Technology Consulting Co., Ltd., Hsinchu (TW)

( * ) Notice: Subject to any disclaimer, the term of this patent is extended or adjusted under 35 U.S.C. 154(b) by 0 days.

(21) Appl. No.: 14/083,474

(22) Filed: Nov. 19, 2013

(65) Prior Publication Data

US 2015/0132686 A1    May 14, 2015

(30) Foreign Application Priority Data

Nov. 11, 2013    (CN) .......................... 2013 1 05582042

(51) Int. Cl.
*G02B 5/20*    (2006.01)
*G03F 7/00*    (2006.01)

(52) U.S. Cl.
CPC .................................. *G03F 7/0007* (2013.01)

(58) Field of Classification Search
CPC ........ G03F 7/0007; G02B 5/20; G02B 5/201; G02B 5/223; G02F 1/133516
USPC ............................................................. 430/7
See application file for complete search history.

(56) References Cited

U.S. PATENT DOCUMENTS

2005/0019679 A1*    1/2005    Lo et al. ........................... 430/7

FOREIGN PATENT DOCUMENTS

JP                2-053003 A    *    2/1990

* cited by examiner

*Primary Examiner* — John A McPherson
(74) *Attorney, Agent, or Firm* — Novak Druce Connolly Bove + Quigg LLP

(57) ABSTRACT

A method manufactures a color filter including a transparent substrate, a black matrix and a resin layer having at least two colors of resin patterns. During an exposing process of the color filter, a particular photo mask is used to expose from a side of the transparent substrate adjacent to the black matrix. At a same time, the transparent substrate is exposed from another side of the transparent away from the black matrix without using the photomask.

13 Claims, 6 Drawing Sheets

METHOD FOR MANUFACTURING COLOR FILTER

BACKGROUND

1. Technical Field

Embodiments of the present disclosure relate to a color filter structure and its manufacturing method, and more particularly, to a method for manufacturing a color filter using a particular photomask in an exposure process.

2. Description of Related Art

During an exposure process of manufacturing a color filter of a liquid crystal display (LCD), alignment error between a black matrix and a photomask may cause the LCD to exhibit light leaking and color confusion. With an increased resolution of the LCD, size of each light blocking portion of the black matrix is decreased upon the condition of the size of the LCD is unchanged. Thus, the alignment between the black matrix and the photomask becomes more and more difficult, which may affect the quality of the color filter of the LCD. Therefore, a solution for overcoming the alignment error between the black matrix and the photomask is needed.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean "at least one".

Figure 1:
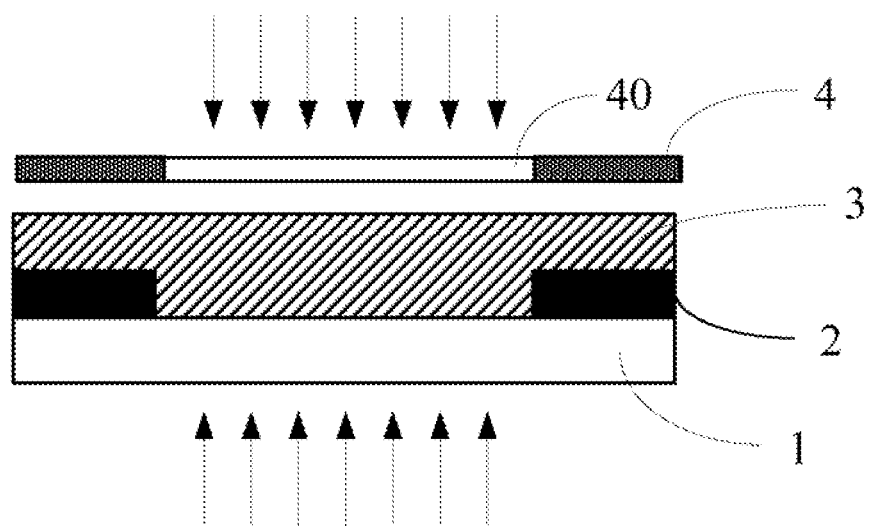
FIG. 1 shows a process of manufacturing a color filter according to an exemplary embodiment.
Figure 2:
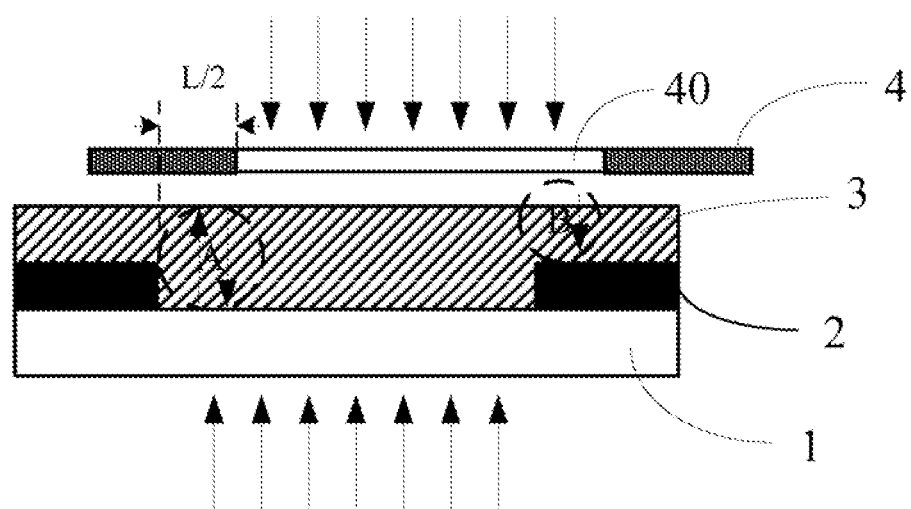
FIG. 2 shows certain of alignment error between a black matrix and a photomask of FIG. 1.
Figure 3:
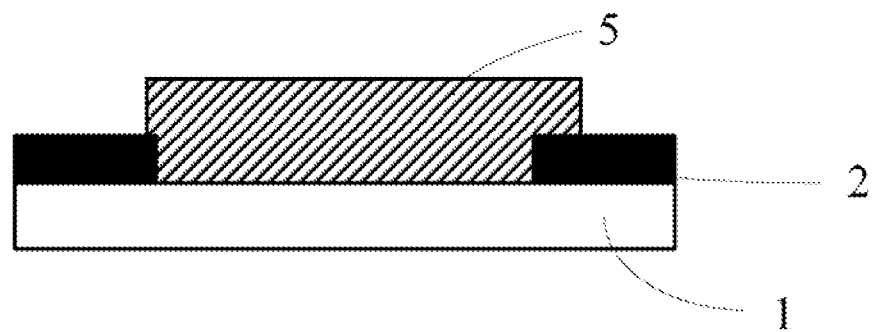
FIG. 3 shows a resin pattern formed on a transparent substrate of FIG. 1.

FIGS. 1-3 show a process of manufacturing a color filter. In the embodiment, the color filter includes a transparent substrate 1, a black matrix 2 and a resin layer 3 having at least two colors of resin patterns formed on the transparent substrate 1. The process of manufacturing the color filter includes the following described steps.

In step S1, the black matrix 2 is formed on the transparent substrate 1. In the embodiment, the black matrix 2 is formed on the transparent substrate 1 using, for example, a spattering method, a depositing method, or a coating method. The transparent substrate 1 is made of transparent materials, such as glass, transparent resin, quartz, or transparent plastic. The black matrix 2 includes a plurality of light blocking portions (not labeled) having a same width. Each two of the light block portions are spaced a certain distance from each other.

In step S2, at least two colors (e.g., red, green, and blue) of resin patterns 5 are formed on the transparent substrate where the black matrix 2 is formed. In this embodiment, a process of forming each color of resin patterns includes steps of: (a) coating a corresponding color of resin layer 3 on the transparent substrate 1 to cover the black matrix 2 and the transparent substrate 1; (b) exposing the transparent substrate 1 having the resin layer 3 from two opposite sides. In the exposing step, a photomask 4 is used and exposure light is exposed from a side of the transparent substrate 1 adjacent to the black matrix 2. At the same time, exposure light is exposed from another side of the transparent substrate 1 away from the black matrix 2 without using the photomask 4. When the exposing step has been accomplished, a developing step is performed to form the corresponding color of resin patterns on the transparent substrate 1.

In this embodiment, the photomask 4 includes a plurality of light through portions 40 (only one 40 is shown in FIGS. 1-3). In view of the above, even if certain alignment errors happen between the black matrix 2 and the photomask 4, issues of light leaking and color confusion of the color filter can be avoided by exposing the transparent substrate 1 from two opposite sides.

FIG. 2 shows that the alignment error exists between the black matrix 2 and the photo mask 4, for example, when the photomask 4 offsets towards a light blocking portion of the black matrix 2 for a half width of the light blocking portion. At this time, each light through portion 40 of the photomask 4 is staggered with a space between two adjacent light blocking portions of the black matrix 2 as shown in FIG. 2. During the exposing step, an area (e.g., area A of FIG. 2) adjacent to a side of one of the two adjacent light blocking portions are exposed by exposure light from two opposite sides of the transparent substrate 1. That is, there is enhanced light power within the area A. Thus, free-radical reaction would happen at the area A due to the enhanced light power, thereby causing certain color resins to remain on a portion of the corresponding light blocking portion shielded by the photomask 4 even if no exposure light passes through this portion of the corresponding light blocking portion. The free-radical reaction is a chemical reaction involving free radicals happened within the resin layer 3, which is induced by the enhanced light power. Further, exposure light from a single direction would be exposed to an area (e.g., area B of FIG. 2) above another of the two adjacent light blocking portions, thereby certain color resin remains. Each resin pattern 5 of the corresponding color as shown in FIG. 3 may be formed after the developing step. Since color resin remains above each two adjacent light blocking portions of the black matrix, the color resin also remains between each two adjacent light blocking portions using the above mentioned exposing manner, the issues of light leaking and color confusion are avoided.

In this embodiment, some most allowed alignment error between the black matrix 2 and the photomask 4 is shown in the following table. The width L of each light blocking portion of the black matrix 2 is 3-10 um, the offset distance of the photomask 4 towards the black matrix 2 should be less than a half of the width L of each light blocking portion (½).

| L (um)      | 10 | 9   | 8 | 7   | 6 | 5   | 4 | 3   |
|-------------|----|-----|---|-----|---|-----|---|-----|
| Offset (um) | 5  | 4.5 | 4 | 3.5 | 3 | 2.5 | 2 | 1.5 |

Figure 4:
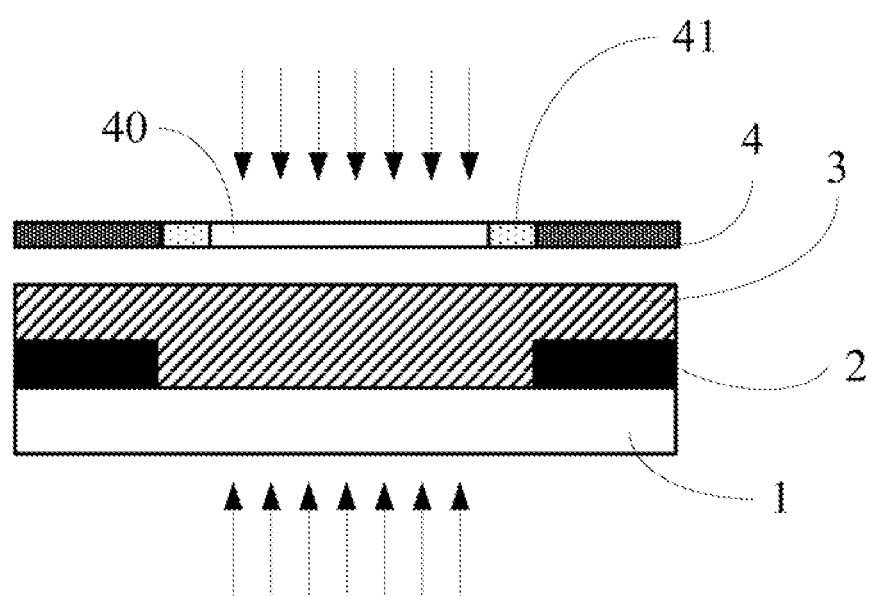
FIG. 4 shows a translucent mask of the photomask is arranged at a first location.

In another embodiment, as shown in FIG. 4, the photomask 4 has a translucent mask 41 at each edge of each light through portion 40 for controlling a thick of the resin layer 3 formed on the transparent substrate 1. In one embodiment, a transmittance of light through the translucent mask 41 is greater than 10% and less than 90%. In other embodiments, the transmittance of the translucent mask 41 is greater than 30% and less than 70%.

FIG. 4 shows that each translucent mask 41 is located above an area between two adjacent light blocking portions of the black matrix 2, to allow exposure light to pass through each translucent mask 41 and pass through the transparent substrate 1. That is, a sum of a width of two adjacent translucent masks 41 and a width of the light through portion 40 between the two adjacent translucent masks 41 is equal to a distance between each two light blocking portions of the black matrix 2.

Figure 5:
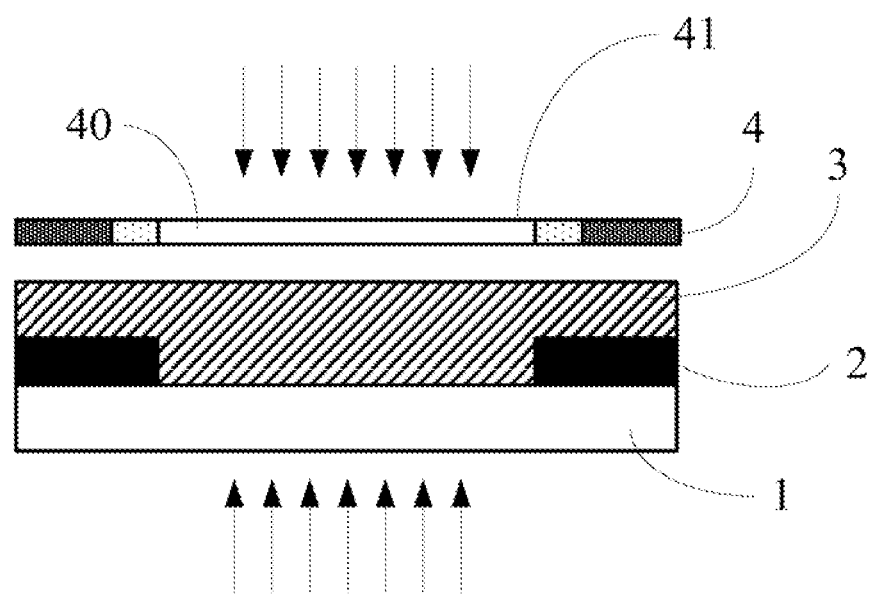
FIG. 5 shows the translucent mask of the photomask is arranged at a second location.

In an exemplary embodiment, as shown in FIG. 5, each translucent mask 41 is located above a light blocking portion of the black matrix 2, to make the exposure light through each translucent mask 41 to be blocked by the light blocking portion. That is, a sum of a width of two adjacent translucent masks 41 and a width of the light through portion 40 between the two adjacent translucent masks 41 is greater than the distance between each two light blocking portions of the black matrix 2. In addition, the width of the light through portion 40 between the two adjacent translucent masks 41 is equal to the distance between each two light blocking portions of the black matrix 2.

Figure 6:
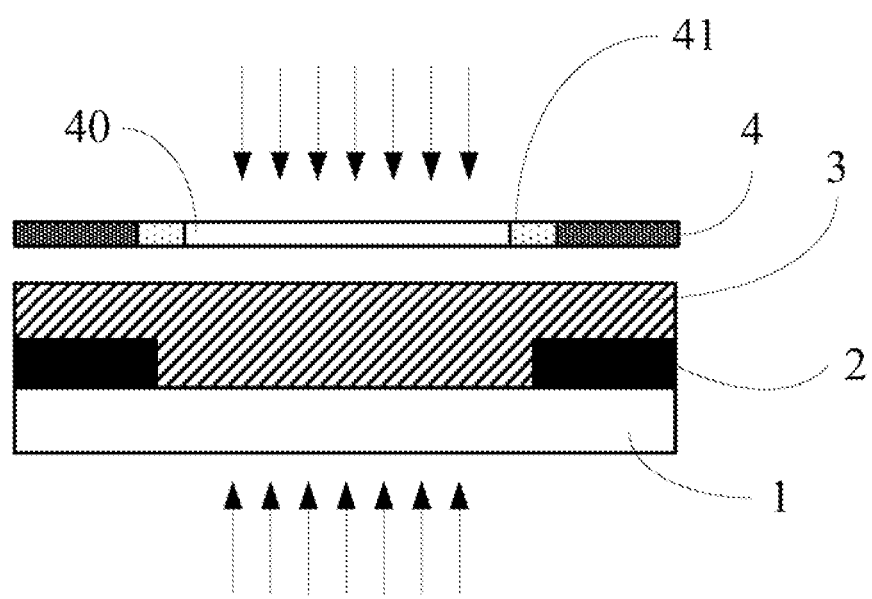
FIG. 6 shows the translucent mask of the photomask is arranged at a third location.

In another exemplary embodiment, as shown in FIG. 6, each translucent mask 41 includes a first portion and a second portion. The first portion is located above the area between two adjacent light blocking portions of the black matrix 2, to allow the exposure light to pass through this portion of each translucent mask 41 and pass through the transparent substrate 1. The second portion is located above a light blocking portion of the black matrix 2, to make the exposure light through the other portion of each translucent mask 41 to be blocked by the light blocking portion. That is, a sum of a width of the two adjacent translucent masks 41 and a width of the light through portion 40 between the two adjacent translucent masks 41 is greater than the distance between each two light blocking portions of the black matrix 2. In addition, the width of the light through portion 40 between the two adjacent translucent masks 41 is less than the distance between each two light blocking portions of the black matrix 2. In the illustrated embodiment, a vertical central line of each translucent mask 41 is aligned with an end of one of the light blocking portions of the black matrix 2.

A relationship between the width of each translucent mask 41 and the width of each light blocking portion of the black matrix 2 is shown in the following table. It is understood that, the width of each translucent mask 41 is less than or equal to a half width of each light blocking portion of the black matrix 2.

| Light blocking portion (um) | 10 | | | | 9 | | | | 8 | | | |
|---|---|---|---|---|---|---|---|---|---|---|---|---|
| Translucent mask (um) | 0.5 | 1.0 | ... | 5.0 | 0.5 | 1.0 | ... | 4.5 | 0.5 | 1.0 | ... | 4.0 |
| Light blocking portion (um) | 7 | | | | 6 | | | | 5 | | | |
| Translucent mask (um) | 0.5 | 1.0 | ... | 3.5 | 0.5 | 1.0 | ... | 3.0 | 0.5 | 1.0 | ... | 2.5 |
| Light blocking portion (um) | 4 | | | | 3 | | | | | | | |
| Translucent mask (um) | 0.5 | 1.0 | 1.5 | 2.0 | 0.5 | 1.0 | 1.5 | | | | | |

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A method for manufacturing a color filter, the color filter comprising a transparent substrate, the method comprising:

forming a black matrix on the transparent substrate; and forming at least two colors of resin patterns on the transparent substrate where the black matrix is formed, wherein a process of forming each color of resin patterns comprises:

(a) coating a corresponding color of resin layer on the transparent substrate to cover the black matrix and the transparent substrate; and (b) exposing the transparent substrate having the resin layer from two opposite sides of the transparent substrate at the same time, wherein a first group of light is exposed from a side of the transparent substrate adjacent to the black matrix using a photomask, and a second group of light is exposed from another side of the transparent substrate away from the black matrix without using the photomask at the same time when the first group of light is exposed.

2. The method according to claim 1, wherein the transparent substrate is made of glass, transparent resin, quartz, or transparent plastic.

3. The method according to claim 1, wherein the photomask comprises a plurality of light through portions and a translucent mask at each edge of each light through portion.

4. The method according to claim 3, wherein a transmittance of light through the translucent mask is greater than 10% and less than 90%.

5. The method according to claim 3, wherein a transmittance of light through the translucent mask is greater than 30% and less than 70%.

6. The method according to claim 3, wherein the black matrix comprises a plurality of light blocking portions, and a width of each translucent mask is less than or equal to a half width of each light blocking portion of the black matrix.

7. The method according to claim 3, wherein each translucent mask is located above an area between two adjacent light blocking portions of the black matrix.

8. The method according to claim 7, wherein a sum of a width of two adjacent translucent masks and a width of the light through portion between the two adjacent translucent masks is equal to a distance between each two light blocking portions of the black matrix.

9. The method according to claim 3, wherein each translucent mask is located above a light blocking portion of the black matrix.

10. The method according to claim 9, wherein a sum of a width of two adjacent translucent masks and a width of the light through portion between the two adjacent translucent masks is greater than the distance between each two light blocking portions of the black matrix, and the width of the light through portion between the two adjacent translucent masks is equal to the distance between each two light blocking portions of the black matrix.

11. The method according to claim 3, wherein each translucent mask comprises a first portion located above an area between two adjacent light blocking portions of the black matrix and a second portion located above a light blocking portion of the black matrix.

12. The method according to claim 11, wherein a sum of a width of two adjacent translucent masks and a width of the light through portion between the two adjacent translucent masks is greater than a distance between each two light blocking portions of the black matrix, and the width of the light through portion between the two adjacent translucent masks is less than the distance between each two light blocking portions of the black matrix.

13. The method according to claim 11, wherein a vertical central line of each translucent mask is aligned with an end of one of the light blocking portions of the black matrix.

* * * * *